(12) United States Patent
Jones et al.

(10) Patent No.: US 7,741,702 B2
(45) Date of Patent: Jun. 22, 2010

(54) SEMICONDUCTOR STRUCTURE FORMED USING A SACRIFICIAL STRUCTURE

(75) Inventors: Bailey R. Jones, Mohnton, PA (US); Sean Lian, Singapore (SG); Simon John Molloy, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 16 days.

(21) Appl. No.: 11/927,978

(22) Filed: Oct. 30, 2007

(65) Prior Publication Data
US 2008/0054481 A1 Mar. 6, 2008

Related U.S. Application Data

(62) Division of application No. 11/094,975, filed on Mar. 31, 2005, now Pat. No. 7,329,605.

(51) Int. Cl.
*H01L 23/552* (2006.01)
(52) U.S. Cl. .............................. 257/659; 257/E23.151
(58) Field of Classification Search .................. 257/659, 257/E23.151
See application file for complete search history.

(56) References Cited

U.S. PATENT DOCUMENTS

2002/0066942 A1* 6/2002 Opolka et al. ................ 257/659

* cited by examiner

*Primary Examiner*—David A Zameke
*Assistant Examiner*—Jenny L Wagner
(74) *Attorney, Agent, or Firm*—Ryan, Mason & Lewis, LLP

(57) ABSTRACT

A semiconductor structure is provided which eliminates the contact resistance traditionally associated with a junction between one or more contacts and a buried conductive structure formed in the semiconductor structure. The semiconductor structure includes a first insulating layer formed on a semiconductor layer and a conductive structure formed on at least a portion of the first insulating layer. A second insulating layer is formed on at least a portion of the conductive structure. At least one contact is formed through the second insulating layer and electrically connected to the conductive structure. The contact and the conductive structure are formed as a substantially homogeneous structure in a same processing step.

20 Claims, 3 Drawing Sheets

US 7,741,702 B2

SEMICONDUCTOR STRUCTURE FORMED USING A SACRIFICIAL STRUCTURE

CROSS-REFERENCE TO RELATED APPLICATION(S)

This application is a divisional of U.S. application Ser. No. 11/094,975 filed on Mar. 31, 2005, which issued as U.S. Pat. No. 7,329,605 on Feb. 12, 2008, the disclosure of which is incorporated herein by reference.

FIELD OF THE INVENTION

The present invention relates generally to semiconductor devices, and more particularly relates to techniques for forming a conductive structure in a semiconductor device using at least one sacrificial structure.

BACKGROUND OF THE INVENTION

In semiconductor devices, it is common to form a conductive structure that is buried within one or more insulating layers. The conductive structure is usually formed on a first dielectric layer (e.g., silicon dioxide) using conventional photolithographic patterning and etching. A second dielectric layer is then formed over the conductive structure. Electrical connection to the conductive structure is provided by a contact. The contact is typically formed by etching a contact window through the second dielectric layer to expose the conductive structure and, in a subsequent processing step, filling the contact window with a metal, such as aluminum. FIG. 1 is a cross-sectional view illustrating a standard lateral diffused metal-oxide-semiconductor (LDMOS) device 100 including a gate shield 102 which is formed in the manner described above.

One disadvantage of this conventional methodology of forming a buried conductive structure (e.g., gate shield 102) is that there is often a significant resistance associated with a junction (e.g., 106) between the contact (e.g., 104) and the conductive structure. This resistance, commonly referred to as contact resistance, is often greater than about twenty ohms, and can be as high as about 100 ohms. In a power semiconductor device, for example, wherein there may be a large current (e.g., milliamperes) passing through the contact, this contact resistance can significantly degrade device performance. It is therefore desirable to minimize contact resistance in a semiconductor device.

Previous attempts to minimize the contact resistance associated with a buried conductive structure have involved the use of polysilicon material for the conductive structure and contact. Polysilicon is easily patterned by conventional lithography and etch techniques, and can withstand high temperatures used in semiconductor processing. Unfortunately, however, polysilicon has a relatively high sheet resistance (e.g., typically about 30 to 200 ohms per square) which limits the conductivity of the conductive structure. Although it is known to form a silicide layer on the polysilicon in order to reduce the sheet resistance of the conductive structure, patterning a polysilicon layer that is reacted to form a silicide, such as titanium silicide, involves complicated processing steps and high temperature to form the silicide, thereby increasing the cost of fabrication and reducing yield. In alternative methodologies, aluminum has been used to form the conductive structure and the contact. Using aluminum to form the conductive structure, however, limits the temperatures at which the wafer can be subsequently processed, and is thus undesirable.

Accordingly, there exists a need for techniques for forming a buried conductive structure in a semiconductor device, and for providing electrical connection to the conductive structure, which does not suffer from one or more of the problems exhibited by conventional methodologies.

SUMMARY OF THE INVENTION

The present invention meets the above-noted need by providing, in an illustrative embodiment, techniques for forming a buried conductive structure in a semiconductor device such that contact resistance is substantially eliminated. To accomplish this, a sacrificial structure is formed in the device. The sacrificial structure is then removed, thereby creating a cavity within the device which essentially functions as a mold for defining a shape of the resulting conductive structure. One or more contacts providing electrical connection to the conductive structure are formed in the same processing step as the conductive structure itself, thereby eliminating the contact resistance traditionally associated with a junction between the one or more contacts and the conductive structure.

In accordance with one aspect of the invention, a method of forming a buried conductive structure in a semiconductor device includes the steps of forming a first insulating layer on a semiconductor layer; forming a sacrificial structure on at least a portion of the first insulating layer; forming a second insulating layer on at least a portion of the sacrificial structure; forming at least one opening through the second insulating layer to at least partially expose the sacrificial structure; substantially removing the sacrificial structure, leaving a cavity; and substantially filling the cavity and the at least one opening with a conductive material. The sacrificial structure may be substantially removed by etching the sacrificial structure using an isotropic etchant.

In accordance with another aspect of the invention, a semiconductor structure includes a first insulating layer formed on a semiconductor layer, a conductive layer formed on at least a portion of the first insulating layer, and a second insulating layer formed on at least a portion of the conductive layer. One or more contacts are formed through the second insulating layer and electrically connecting to the conductive layer. At least a given one of the contacts and the conductive layer are formed as a substantially homogeneous structure in a same processing step. The conductive layer and the one or more contacts are preferably created by forming a sacrificial structure on at least a portion of the first insulating layer, forming the second insulating layer on at least a portion of the sacrificial structure, forming at least one opening through the second insulating layer to expose at least a portion of the sacrificial structure, substantially removing the sacrificial structure, thereby leaving a cavity in the second insulating layer, and filling the cavity and the at least one opening with a conductive material.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of an illustrative MOS device. It should be understood, however, that the techniques of the present invention are not limited to this or any particular semiconductor device. Rather, the invention is more generally applicable to techniques for eliminating contact resistance, traditionally associated with a buried conductive structure in a semiconductor device, by forming the conductive structure in a same processing step as one or more contacts providing electrical connection to the conductive structure. Furthermore, the buried conductive structure and corresponding contact(s) may be formed using standard semiconductor processing methodologies, and thus the cost of fabricating the conductive structure is not significantly increased. Although the present invention is described herein with specific reference to a complementary metal-oxide-semiconductor (CMOS) fabrication process, it is to be understood that the invention is not limited to such a fabrication process, and that other suitable fabrication processes (e.g., bipolar, BiCMOS, etc.), may be similarly employed, as will be understood by those skilled in the art.

FIGS. 2-5 are cross-sectional views depicting steps in an illustrative methodology which may be used to form at least a portion of an exemplary MOS device, in accordance with one aspect of the present invention. The illustrative methodology will be described in the context of a conventional CMOS compatible semiconductor fabrication process technology. As previously stated, the invention is not limited to this or any particular methodology for fabricating the device, nor is the resulting conductive structure limited to use in an MOS device. For example, the techniques of the present invention described herein can be beneficial in forming passive semiconductor components (e.g., capacitors, resistors, etc.). It is to be understood that the various layers and/or regions shown in the accompanying figures may not be drawn to scale. Furthermore, one or more semiconductor layers of a type commonly used in such integrated circuit (IC) structures may not be explicitly shown in a given figure for ease of explanation. This is not intended to imply that the semiconductor layer(s) not explicitly shown is(are) omitted in the actual IC device.

Figure 1:
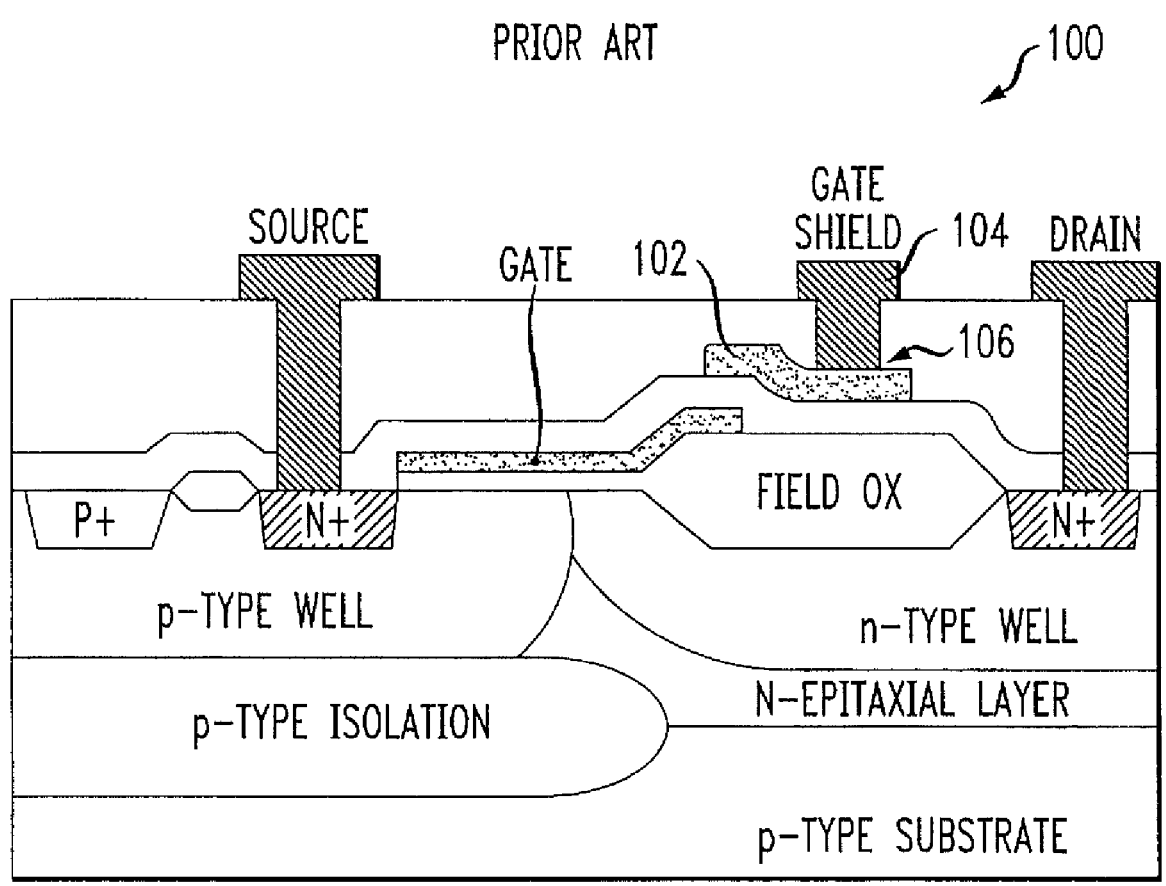
FIG. 1 is a cross-sectional view depicting at least a portion of a conventional metal-oxide-semiconductor (MOS) device.
Figure 2:
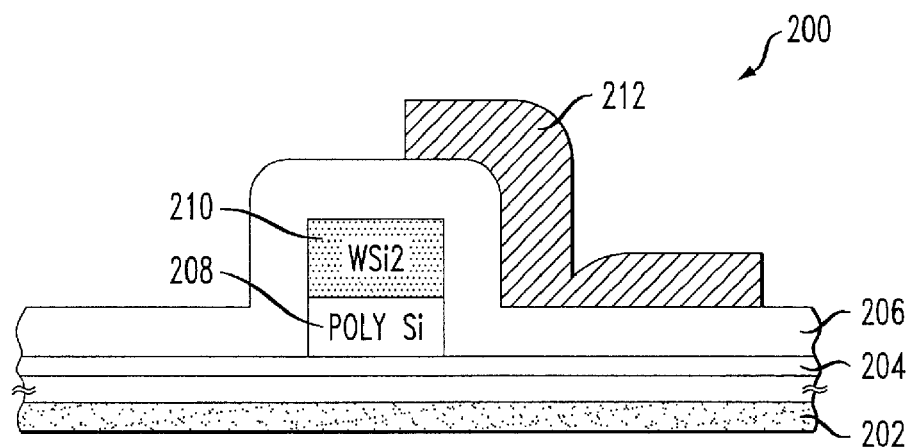
FIGS. 2-5 are cross-sectional views depicting steps in an illustrative methodology which may be used to form at least a portion of an exemplary MOS device, in accordance with one embodiment of the present invention.

With reference to FIG. 2, a semiconductor wafer 200 is shown in which the techniques of the present invention are implemented. The wafer 200 includes a semiconductor substrate 202. The substrate 202 is commonly formed of single-crystal silicon (e.g., having a <100> or <111> crystal orientation) which has been modified by adding an impurity or dopant to change a conductivity of the material as desired (e.g., n-type or p-type). An epitaxial layer (not shown), in which active regions of the MOS device may be formed, is typically formed on an upper surface of the substrate 202, such as by using a standard epitaxy process, as will be understood by those skilled in the art.

The term "semiconductor layer" as may be used herein refers to any semiconductor material upon which and/or in which other materials may be formed. The semiconductor layer may comprise a single layer, such as, for example, substrate 202, or it may comprise multiple layers, such as, for example, the substrate and epitaxial layer. The semiconductor wafer 200 comprises the substrate 202, with or without the epitaxial layer, and preferably includes one or more other semiconductor layers formed on the substrate. The term "wafer" is often used interchangeably with the term "silicon body," since silicon is typically employed as the semiconductor material comprising the wafer. It should be appreciated that although the present invention is illustrated herein using a portion of a semiconductor wafer, the term "wafer" may include a multiple-die wafer, a single-die wafer, or any other arrangement of semiconductor material on which and/or in which a semiconductor structure may be formed.

A gate 208 is preferably formed on the wafer 200. The gate 208 is electrically isolated from active regions (e.g., source and drain regions) of the MOS device (not shown) by a first insulating layer 204. The first insulating layer 204 typically comprises, but is not limited to, an oxide (e.g., silicon dioxide), and is therefore often referred to as a gate oxide layer. The insulating layer 204 may be grown using a conventional thermal oxidation process, although alternative methodologies for forming an insulating layer on the semiconductor wafer 200 are similarly contemplated (e.g., oxide deposition, etc.). The gate 208 typically comprises polysilicon material, although alternative materials (e.g., metal, etc.) may be used. A gate electrode 210 is preferably formed on an upper surface of the gate 208. The gate electrode 210 may comprise, for example, tungsten silicide ($WSi_2$), and helps reduce a resistance of the gate 208. Although alternative materials may be used for forming the gate electrode, tungsten silicide is a preferred material, since tungsten silicide has a substantially low sheet resistance (e.g., less than about one ohm per square) and is better able to withstand high temperatures used for subsequent semiconductor process steps compared to other materials, such as, for example, aluminum.

After the gate electrode 210 is patterned and preferably after all of the standard impurity implants (e.g., boron, arsenic, phosphorus, etc.) which may be necessary to form the MOS device have been completed, a second insulating layer 206 is formed on at least a portion of an upper surface of the wafer 200, such as by using a thermal oxidation and/or an oxide deposition process. The first and second insulating layers 204, 206 preferably comprise the same material, such as, for example, silicon dioxide, although alternatively the first and second insulating layers may comprise different insulating materials relative to one another, such as, but not limited to, silicon nitride and silicon dioxide. The first and second insulating layers 204, 206 electrically isolate the gate 208 and gate electrode 210 from other semiconductor structures which may be formed on the wafer 200.

A sacrificial structure 212 is formed on an upper surface of at least a portion of the second insulating layer 206. The sacrificial structure 212 comprises a material that is substantially removed in a subsequent processing step, such as, for example, by etching. Sacrificial structure 212 may be patterned using, for example, conventional lithography and etching processes, as will be understood by those skilled in the art. The sacrificial structure 212 preferably comprises, for example, titanium, titanium nitride, and/or aluminum, although the invention is not limited to these materials. In a preferred embodiment of the invention, the sacrificial structure 212 comprises a titanium and/or titanium nitride film. The titanium and/or titanium nitride film may be etched, for example, in a metal etch tool using chlorine ($Cl_2$) based chemistry. Alternatively, the titanium and/or titanium nitride film can be etched, for example, using trifluoromethane ($CHF_3$) or tetrafluoromethane ($CF_4$) based chemistry. The material used in forming the sacrificial structure 212 is preferably selected such that it can be easily removed (e.g., by etching), without removing unintended semiconductor structures adjacent to the sacrificial structure (e.g., second insulating layer 206).

A shape of the sacrificial structure 212 will essentially be used as a mold to define, at least in significant part, a shape of a conductive structure subsequently formed in the wafer 200, as will be described in further detail below. In the exemplary cross section depicted in FIG. 2, the sacrificial structure 212 will be used to form a gate shield. However, it is to be understood that the invention is not limited to any particular shape and/or application of the sacrificial structure and corresponding conductive structure.

Figure 3:
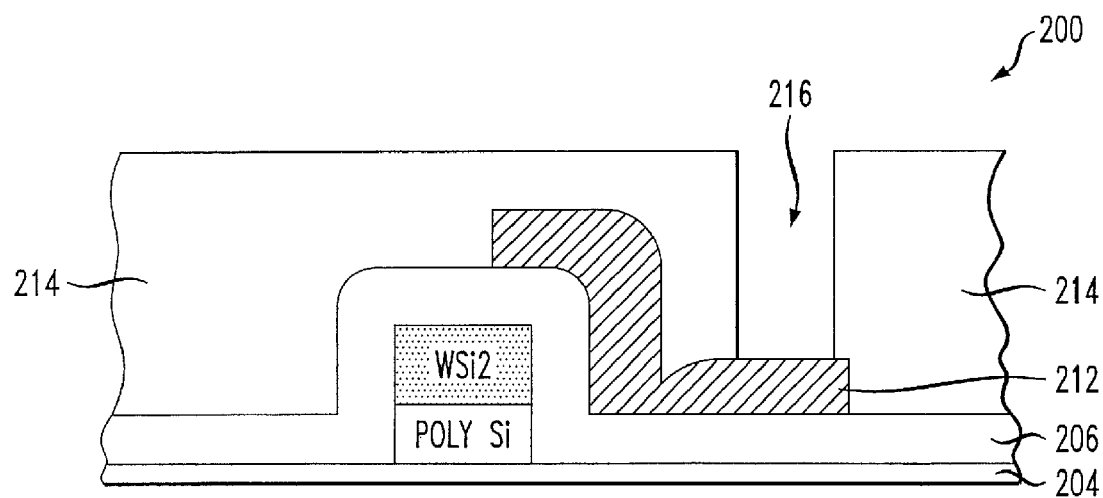

With reference to FIG. 3, a third insulating layer 214 is preferably formed over an upper surface of the wafer 200, including at least a portion of sacrificial structure 212. Third insulating layer 214 may be formed using, for example, a standard thermal oxidation and/or oxide deposition process. In a preferred embodiment of the invention, the third insulating layer 212 comprises silicon dioxide, although alternative insulating materials may be similarly employed, including, for example, silicon nitride. As apparent from the figure, the sacrificial structure 212 is electrically isolated from adjacent semiconductor structures, being essentially buried between the second and third insulating layers 206, 214.

As previously stated, the sacrificial structure 212 is substantially removed, such as by using a standard etching process (e.g., wet etching, dry etching, etc.). In order to remove the sacrificial structure 212, at least one contact window 216, or an alternative opening (e.g., trench, etc.), is preferably formed through the third insulating layer 214 to at least partially expose the sacrificial structure. The contact window 216 may be formed, for example, by anisotropic etching, reactive ion etching (RIE), etc., as will be understood by those skilled in the art. The sacrificial structure 212 may then be removed, for example, in an acid solution, such as, but not limited to, sulfuric acid ($H_2SO_4$), although alternative methodologies for removing the sacrificial structure are similarly contemplated. The present invention is not limited to any particular etchant used to remove the sacrificial structure 212, although the etchant should be isotropic, so as to etch substantially equally in all directions. The etchant chosen should also be substantially non-reactive with the semiconductor material(s) (e.g., silicon dioxide) adjacent to the sacrificial structure 212 (e.g., second and third insulating layers 206, 214), so that certain portions of the wafer 200 are not inadvertently removed. The type of material selected as the etchant will be dependent on the material used to form the sacrificial structure 212.

Figure 4:
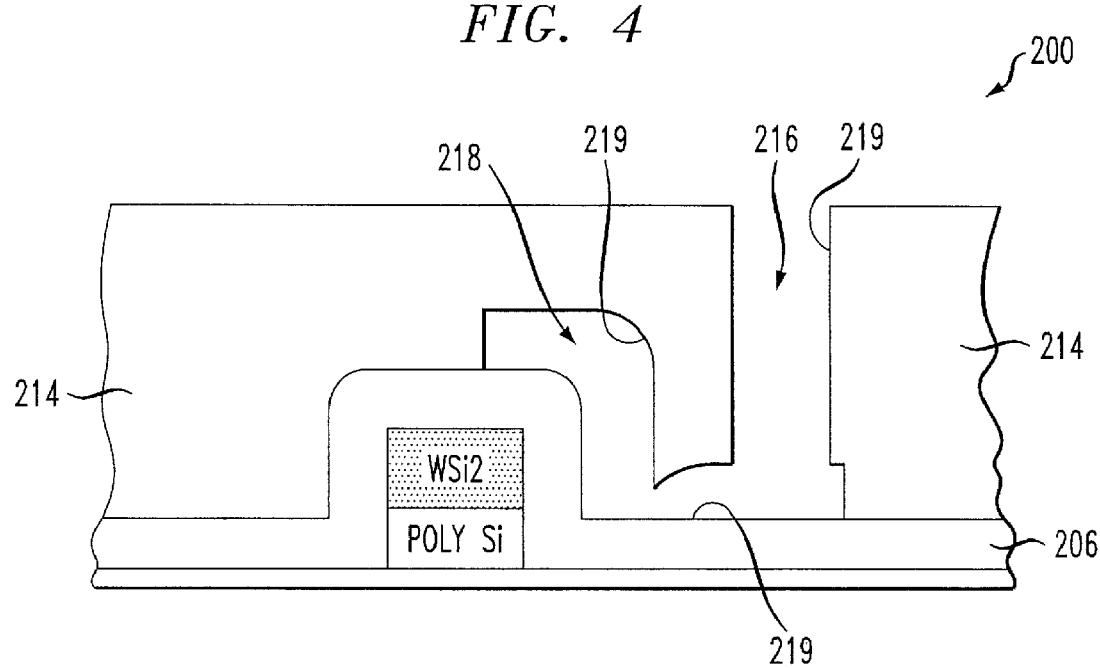

As shown in FIG. 4, once the sacrificial structure has been removed, a cavity 218, comprising sidewalls 219, is formed between the second and third insulating layers 206, 214. The term "cavity" as used herein is intended to refer to an enclosed volume (e.g., opening, hole, chamber, etc.), such as a hollow area defined by one or more sidewalls substantially surrounded by something (e.g., second and third insulating layers 206, 214). The shape of the cavity 218 will be defined primarily by the shape of the removed sacrificial structure. In this manner, the cavity 218, in conjunction with the contact window 216, serves as a mold for subsequently forming a corresponding conductive structure.

Figure 5:
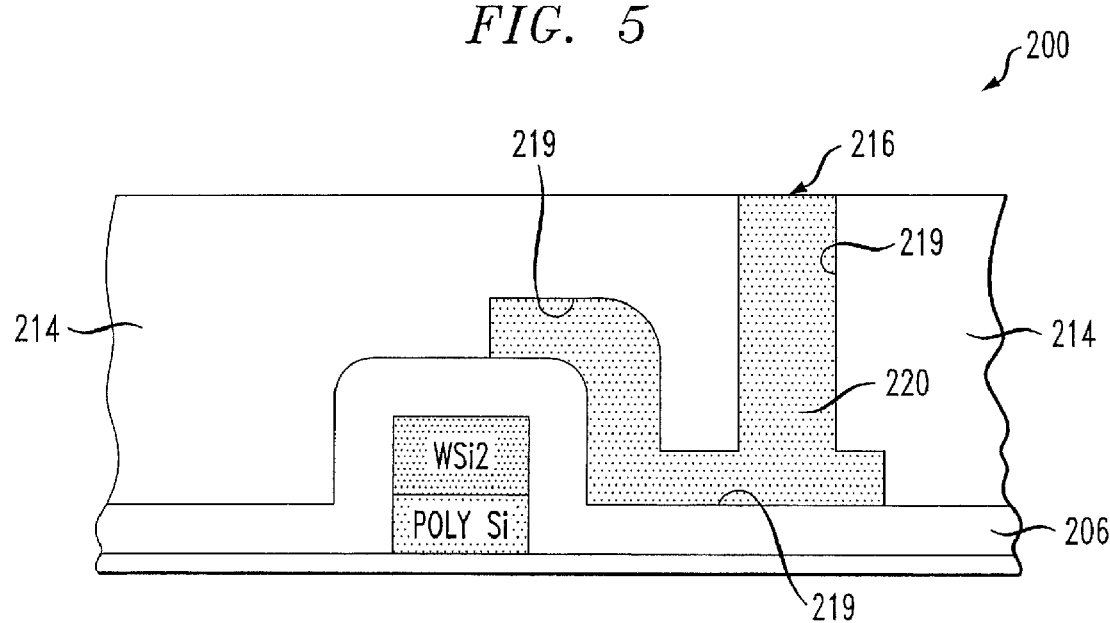

FIG. 5 illustrates an exemplary process step in which the cavity 218 and contact window 216 are substantially filled with a conductive material, such as, but not limited to, tungsten, to form a conductive structure 220. As apparent from the figure, the resulting conductive structure 220 is at least partially buried between the second insulating layer 206 and third insulating layer 214. The cavity 218 and contact window 216 (see FIG. 4) are filled substantially concurrently, such as, for example, by using a chemical vapor deposition (CVD) process, so as to form a substantially homogeneous conductive structure. In this manner, a contact resistance in the device, which traditionally contributes to a significant portion of the overall resistance of the conductive structure, can be substantially eliminated.

During the CVD process, tungsten hexafluoride ($WF_6$), or an alternative conductive material is preferably conformally deposited on the sidewalls 219 defining the cavity 218 and contact window 216 (see FIG. 4), such that a thickness of the deposited tungsten is substantially constant throughout the cavity and opening. Alternative methodologies for filling the cavity 218 and contact window 216 with a conductive material are similarly contemplated by the invention. Excess conductive material on an upper surface of the third insulating layer 214, outside of the contact window 216, may be removed, for example, by chemical and/or mechanical polishing, so that the upper surface of the wafer 200 is substantially planar. Metal patterning, as may be required for forming interconnections, contacts, etc., in the IC device, may then proceed in a conventional manner.

As previously stated, the techniques of the present invention can be employed to eliminate an interface between a buried conductive structure in a semiconductor device, and one or more contacts providing electrical connection to the conductive structure, thereby eliminating a contact resistance typically associated with the interface. Moreover, by forming the conductive structure and electrical connection to the conductive structure as a single unit, reliability and yield are significantly improved compared to alternative methodologies. While shown as implementing a gate shield in an MOS device, the invention is not limited to the particular shape and/or application shown.

At least a portion of the techniques of the present invention described herein for eliminating the contact resistance associated with a buried conductive structure may be implemented in an integrated circuit. In forming integrated circuits, a plurality of identical die is typically fabricated in a repeated pattern on a surface of a semiconductor wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A semiconductor structure, comprising:
   a first insulating layer formed on a semiconductor layer;
   a second insulating layer formed on at least a portion of the first insulating layer; and
   a conductive structure comprising:
      a first portion formed between the first insulating layer and the second insulating layer; and
      a second portion formed through the second insulating layer and contiguous to the first portion;
   wherein the conductive structure is formed as a substantially homogeneous single seamless unit without a junction between said first portion and said second portion.

2. The semiconductor structure of claim 1, wherein at least one of the first and second insulating layers comprises silicon dioxide.

3. The semiconductor structure of claim 1, wherein the conductive structure is formed by a process comprising the steps of:
   forming a sacrificial structure on at least a portion of the first insulating layer;

forming the second insulating layer on at least a portion of the sacrificial structure;

forming at least one opening through the second insulating layer to expose at least a portion of the sacrificial structure;

substantially removing the sacrificial structure, thereby leaving a cavity in the second insulating layer; and filling the cavity and the at least one opening with a conductive material.

4. The semiconductor structure of claim 3, wherein the step of substantially removing the sacrificial structure comprises etching the sacrificial structure using an isotropic etchant.

5. The semiconductor structure of claim 3, wherein the step of substantially filling the cavity and the opening with a conductive material comprises depositing the conductive material on sidewalls of the cavity and opening.

6. The semiconductor structure of claim 5, wherein the conductive material is deposited on the sidewalls of the cavity and opening using a chemical vapor decomposition process.

7. The semiconductor structure of claim 3, wherein the conductive material comprises tungsten.

8. The semiconductor structure of claim 1, wherein at least sidewalls of at least the first portion of the conductive structure are defined by removal of a sacrificial structure formed in the semiconductor structure between the first and second insulating layers.

9. The semiconductor structure of claim 1, wherein the conductive structure comprises a cavity substantially filled with a conductive material, sidewalls of the cavity being defined by removal of a sacrificial structure formed in the semiconductor structure between the first and second insulating layers.

10. The semiconductor structure of claim 1, wherein a cross-sectional thickness of at least the first portion of the conductive structure is substantially constant throughout.

11. An integrated circuit including at least one semiconductor structure, the at least one semiconductor structure comprising:

a first insulating layer formed on a semiconductor layer;

a second insulating layer formed on at least a portion of the first insulating layer; and a conductive structure comprising:

a first portion formed between the first insulating layer and the second insulating layer; and a second portion formed through the second insulating layer and contiguous to the first portion;

wherein the conductive structure is formed as a substantially homogeneous single seamless unit without a junction between said first portion and said second portion.

12. The integrated circuit of claim 11, wherein the conductive structure is formed by a process comprising the steps of:

forming a sacrificial structure on at least a portion of the first insulating layer;

forming the second insulating layer on at least a portion of the sacrificial structure;

forming at least one opening through the second insulating layer to expose at least a portion of the sacrificial structure;

substantially removing the sacrificial structure, thereby leaving a cavity in the second insulating layer; and filling the cavity and the at least one opening with a conductive material.

13. The integrated circuit of claim 12, wherein the step of substantially removing the sacrificial structure comprises etching the sacrificial structure using an isotropic etchant.

14. The integrated circuit of claim 12, wherein the step of substantially filling the cavity and the opening with a conductive material comprises depositing the conductive material on sidewalls of the cavity and opening.

15. The semiconductor structure of claim 1, wherein at least the first and second portions of the conductive structure are formed in a same processing step.

16. The semiconductor structure of claim 1, wherein at least the first and second portions of the conductive structure comprise tungsten.

17. The semiconductor structure of claim 3, wherein the first portion of the conductive structure is defined by the cavity and the second portion of the conductive structure is defined by the opening.

18. The semiconductor structure of claim 11, wherein at least the first and second portions of the conductive structure are formed in a same processing step.

19. The semiconductor structure of claim 11, wherein at least the first and second portions of the conductive structure comprise tungsten.

20. The semiconductor structure of claim 12, wherein the first portion of the conductive structure is defined by the cavity and the second portion of the conductive structure is defined by the opening.

* * * * *